METHOD OF MAKING ELECTRICAL CIRCUIT STRUCTURE FOR ELECTRICAL CONNECTIONS BETWEEN COMPONENTS

Filed July 8, 1966

INVENTOR
KENNETH CHARLES ARTHUR BINGHAM

BY Hane and Nydick

ATTORNEY

United States Patent Office 3,525,617

Patented Aug. 25, 1970

3,525,617

METHOD OF MAKING ELECTRICAL CIRCUIT STRUCTURE FOR ELECTRICAL CONNECTIONS BETWEEN COMPONENTS

Kenneth Charles Arthur Bingham, Chalfont Saint Peter, England, assignor to International Computers and Tabulators Limited, Putney, England, a British company Filed July 8, 1966, Ser. No. 563,862
Claims priority, application Great Britain, July 13, 1965, 29,736/65
Int. Cl. H01f *7/06;* H05k *3/30*
U.S. Cl. 96—36.2 3 Claims

ABSTRACT OF THE DISCLOSURE

A structure for supporting and for providing interconnections between integrated circuit chips is formed by depositing power supply conductors on a substrate followed by a layer of insulating material, an earth plane and a further layer of insulating material. After this a set of parallel signal conductors is deposited followed by a layer of insulating photo resist material, a gold film and a second layer of photo resist material. Stripes of the second layer of photo resist are then dissolved to reveal stripes of the gold film. The stripes of gold film are etched away to leave a second set of parallel conductors and to reveal stripes of the layer of insulating photo resist material which are then dissolved away. The stripes cross signal conductors so that two mutually perpendicular sets of conductors are formed which are insulated from each other. Conductive links are formed between conductors of the two sets by depositing a layer of photo resist and then softening the resist at selected crossing points by an electron beam. The softened resist is removed by a solvent and a layer of aluminum is deposited. The remaining resist is then dissolved in an ultrasonically agitated bath taking the unwanted parts of the aluminum layer with it and leaving conductive links connecting conductors of the two sets.

This invention relates to electrical circuit structures in which a plurality of electrical components, for example integrated circuits, are mounted on a substrate for interconnection.

It has previously been proposed to interconnect components mounted on a substrate by forming conductors on both sides of the substrate using printed circuit techniques, the components being connected to the conductors by soldering or welding. Any necessary interconnection between two conductors on opposite sides of the substrate is then made by punching a hole through the conductors and the substrate and forcing a pin or eyelet through the hole. Alternatively, connection may be made by coating the surface of the substrate, within the hole, with a conductive material.

Such methods of forming the conductors, and the interconnections between them, are costly and become progressively more difficult to perform as the sizes of the components, substrates and conductors decrease.

It is an object of the present invention to provide an electrical circuit structure having an improved interconnection system.

According to the present invention, there is provided an electrical circuit structure including a substrate; a plurality of electrical components on said substrate; a set of first parallel conductors formed over said substrate by the vacuum deposition of an electrically-conductive material; a set of second parallel conductors formed over said set of first conductors by the vacuum deposition of electrically-conductive material, and separated from said first conductors by electrically-insulating material, each second conductor crossing said first conductors at a plurality of crossing points and certain of said conductors being connected to said components; and connecting links formed at predetermined crossing points to connect the first conductor to the second conductor at each said predetermined crossing point to form electrically-conductive paths between said components.

One embodiment of the present invention will now be described with reference to the accompanying drawing, in which.

Figures 1, 2, 3:
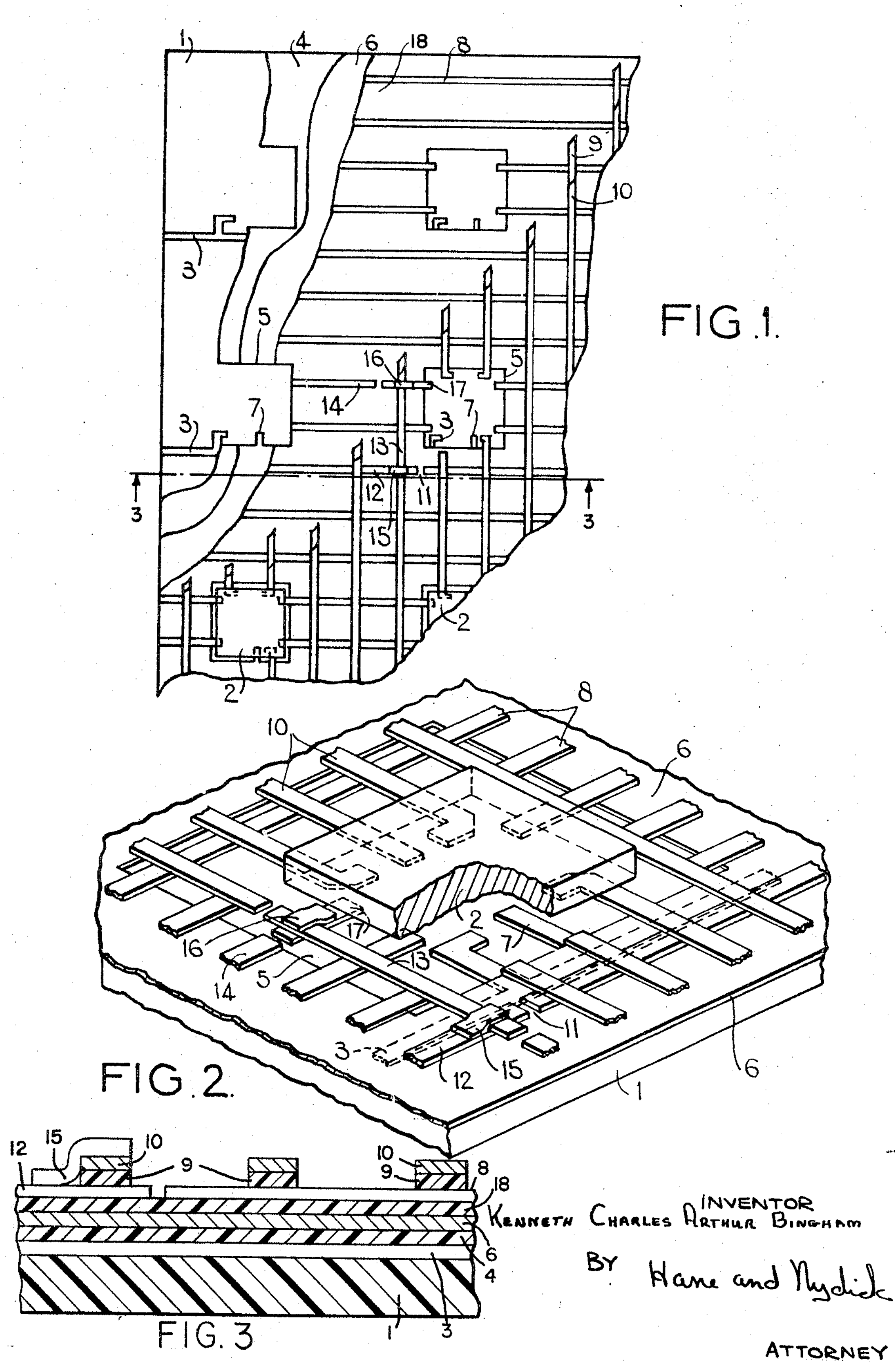
FIG. 1 shows a cut-away plan view of part of an electrical circuit structure.
FIG. 2 shows a pictorial view of a detail of an electrical circuit structure.
FIG. 3 is a view in section of a part of the electrical circuit structure along the line 3—3 of FIG. 1.

Referring now to the drawing, a substrate 1, for supporting a matrix of integrated circuit chips 2, is formed from a sintered alumina ceramic. A set of supply conductors 3, for connecting power supplies to the integrated circuit chips 2, are formed on the substrate 1 by depositing a coating of gold in a glass matrix through a silk screen, and then firing the coating.

An insulating layer 4 is formed over the conductors 3 by coating the substrate 1 and the conductors 3 with a glaze through a silk screen which is patterned to produce a matrix of apertures 5 in the layer 4, the coating being fired after deposition. Alternatively, a continuous glaze coating could be deposited and fired, the apertures 5 then being formed by etching. For the sake of clarity, the layer 4 and a further insulating layer, which is described later, are omitted from FIG. 2.

An earth plane 6 is then formed over the insulating layer 4 by a similar process to that used for depositing the supply conductors 3, the earth plane 6 also having apertures corresponding to the apertures 5. The earth plane 6 has a series of projections 7, one extending into each aperture, for connection to the chips 2. The earth plane 6 provides a return path for the power supply currents and also isolates the conductors 3 from signal conductors which are described below.

A further insulation layer 18, similar to the layer 4, is then formed over the earth plane 6, and a set of parallel signal conductors 8, extending along the substrate 1, is formed on the layer 18 by the vacuum deposition of gold through a mask. Apertures in the mask are such that the conductors 8 extend only a small distance across the apertures 5. The conductors 8 may be of the order of 0.005" wide.

The whole surface is then coated with a layer of a positive photo resist followed by an evaporated gold film. A further layer of the positive resist is deposited overall and a photographic mask is placed over the resist layer, the mask having thereon a pattern of opaque bars corresponding to insulation stripes 9 which are to be formed across the conductors 8 and preferably at right angles to the conductors 8. The top layer of resist is then exposed, through the mask, to ultra-violet light and developed, the exposed parts of the resist being dissolved away to reveal stripes of gold between the wanted insulation stripes 9. These gold stripes are then etched away, revealing stripes of the lower resist layer. These resist stripes are exposed and developed, causing the exposed resist stripes to be dissolved. The remainder of the top layer of resist is also dissolved. Hence, a set of parallel photo resist stripes 9 is formed, with a set of gold signal conductors 10 superimposed thereon. The holes in the mask are of such a shape that the conductors 10 do not cross the apertures 5, but certain of the conductors 10 have projections extending into the apertures 5 for connection to the chips 2.

Two mutually perpendicular sets of signal conductors 8 and 10 have now been formed. Since the insulation 9 beneath the conductors 10 is in the form of stripes, the conductors 8 are exposed between the conductors 10.

In order to obtain the greatest flexibility with this conductor arrangement, it is necessary to make discontinuities in some of the conductors 8 and 10, thereby cutting the conductors 8 and 10 into sections. This operation is performed by a spark machining method in which an electrode is positioned adjacent the conductor 8 or 10, and a spark is produced by the application of a voltage between the electrode and the conductor. Part of the conductor 8 or 10 is thereby removed, forming a discontinuity, such as the discontinuity 11. By forming discontinuities at various points, sections of conductors, for example the sections 12–14, are formed.

Connections between selected conductor sections are made by the formation of conductive links, for example the links 15 and 16, at the crossing points of the selected conductor sections. In order to form the links at predetermined crossing points, a layer of positive photo resist is produced over the whole of the conductor area and this is scanned by an electron beam source which is switched on as each of the predetermined crossing points is scanned. This electron beam softens the resist at those crossing points, and the softened resist is removed by a suitable solvent to leave apertures. A layer of aluminum is then deposited by vacuum deposition over the resist layer. The remaining resist is then removed by a suitable solvent in an ultrasonically-agitated bath, taking the unwanted parts of the aluminium layer with it and leaving only the links. Hence, there is now a conductive path, for example, through the conductor section 12, through the link 15, the section 13, and the link 16, to a portion 17 of one of the conductors 8, projecting into the aperture 5. By extending these processes, very complex conductor configurations may be formed.

If it is desired, at any time, to change the conductor configuration, further links and discontinuities may be produced in a similar manner, links may be removed by spark machining or by chemical action, and unwanted discontinuities may be bridged by new links. Hence a very flexible system of interconnections is provided.

When the required conductor configuration has been formed, the chips 2 (only two of which are shown in FIG. 1 for the sake of clarity) are positioned over the apertures 5 with the connection lands on the chips 2 in contact with those portions of the conductors 3, 8 and 10 and the earth plane 6 which project into the apertures 5. The lands are then welded to those portions by an ultrasonic welding method. To facilitate welding, aluminium or gold pedestals may be attached, for example by plating, to either the conductor portions or the connection lands before the welding operation is performed.

Although, in the above-described embodiment, the substrate 1 is of alumina, it may alternatively be of glass, of silicon, or of a conductive material such as aluminium. In the latter case, a layer of insulating material such as alumina, silicon monoxide or photoresist would be formed over the substrate 1 before deposition of the conductors 3.

The chips 2 may, alternatively, be inserted in recesses in the substrate 1 either before or after the conductors have been deposited. Connection would then be made between the lands and the conductors either during the deposition of the conductors or by means of aluminium links similar to the links 15 and 16. Alternatively the recesses may be replaced by apertures through the substrate 1. The apertures could be filled with a filler, for example, a suitable wax, the conductors then being deposited overlapping the filler. The conductors could then be reinforced by electroplating, the filler removed, the chips 2 put in to the apertures from the underside of the substrate 1 and the conductors connected to the lands by welding, by the deposition of aluminum links or by any other suitable method.

Although the conductors 3, 8 and 10 and the earth plane 6 are said to be of gold, other metals, preferably noble metals, might be used. The conductors 3 may, alternatively, be formed by the vacuum deposition of a chrome or nickel-chrome layer through a suitably-apertured mask, followed by a layer of gold formed in the same manner during the same evacuation cycle. The chrome or nickel-chrome provides a good bond to the alumina substrate 1, whilst the gold provides a conductor which has a low electrical resistance but which is resistant to oxidation.

The insulation layers might alternatively be formed of a photo resist which is exposed through a mask and developed, or they might be formed of a polymer, such as polymerised dimethyl poly-siloxane, or of silicon monoxide or other suitable material.

The gold conductors 8 and 10 may be formed over corresponding chrome or nickel-chrome stripes which would then strengthen the gold conductors.

The layer of insulation 18 might be formed in stripes together with the conductors 8, in the same manner as the insulating stripes 9 and the signal conductors 10.

Other methods of deposition and other metals might be used in place of evaporated aluminum for the links 15 and 16, and alternative methods of exposing the resist at the predetermined crossing points might be used, for example flying spot scanning. Alternatively, the resist could be exposed to ultra-violet light through a mask, but this would necessitate the use of a different mask for each circuit configuration.

Spark machining is a convenient method of forming the discontinuities 11, but other methods such as electron beam or laser beam scanning, chemical etching, mechanical scribing, or severing by condenser discharge might be employed.

Although this interconnection system is particularly advantageous for use with integrated circuits, it may obviously be used for interconnecting other types of electrical (including electronic) components mounted on a substrate.

What is claimed is:

1. A method of producing an electrical circuit structure for interconnecting electrical components including the steps of depositing, on an insulating support surface, a first set of parallel conductors; depositing a layer of electrically insulating material over said first conductors; depositing a layer of electrically conductive material over said electrically insulating layer; depositing a layer of photoresist material over said electrically conductive layer; exposing a plurality of parallel stripes of said photo resist layer to light, said stripes extending obliquely to the conductors of the first set; disolving said exposed stripes of photo resist material to reveal correponding stripes of said electrically conductive layer; forming a second set of parallel conductors crossing said conductors of the first set by removing said stripes of said electrically conductive layer and thereby revealing corresponding stripes of said electrically insulating layer; removing the stripes of said electrically insulating layer to reveal a plurality of portions of each conductor of the first set; masking conductors of the first and second sets leaving areas of the conductors at selected crossing points of the conductors of the first and second sets exposed; and depositing in the exposed areas a layer of electrically conductive material in electrical contact with exposed areas of the conductors to form electrically conductive links between conductors of the first set and conductors of the second set at each selected crossing point.

2. A method as claimed in claim 1 and including the steps of forming a continuous layer of photo resist material over both the first and second sets of conductors; removing the photo resist material at selected crossing points of the conductors of the first and second sets to reveal a part of the conductor of the first set and a part of the conductor of the second set adjacent said selected crossing points; depositing a layer of electrically conductive material in electrical contact with said parts of the conductors to form conductive links between conductors of the first set and conductors of the second set at each selected crossing point; and removing unwanted parts of the second conductive layer to leave only said links by dissolving the remainder of the photo resist layer in an agitated bath.

3. A method of producing an electrical circuit structure as claimed in claim 1 in which polymerised dimethyl polysiloxane is deposited to form the electrically insulating layer.

References Cited

UNITED STATES PATENTS

| | | | |
|---|---|---|---|
| 2,586,854 | 2/1952 | Myers | 317—101 |
| 3,011,379 | 12/1961 | Corwin | 317—101 |
| 3,052,823 | 9/1962 | Anderson et al. | 317—101 |
| 3,142,112 | 7/1964 | Burkig et al. | 174—68.5 |
| 3,293,353 | 12/1966 | Hendriks | 317—101 |
| 3,395,040 | 7/1968 | Pritchard | 117—212 XR |
| 3,319,317 | 5/1967 | Roche et al. | 174—68.5 XR |

CHARLIE T. MOON, Primary Examiner

R. W. CHURCH, Assistant Examiner

U.S. Cl. X.R.

29—628, 604, 625; 174—68.5; 317—101; 340—174; 156—3; 117—212